US 6,574,151 B2

(12) United States Patent
Park

(10) Patent No.: US 6,574,151 B2
(45) Date of Patent: Jun. 3, 2003

(54) SEMICONDUCTOR MEMORY DEVICE AND WRITE DRIVING THEREOF

(75) Inventor: San-Ha Park, Kyoungki-do (KR)

(73) Assignee: Hynix Semiconductor Inc, Kyoungki-do (KR)

(*) Notice: Subject to any disclaimer, the term of this patent is extended or adjusted under 35 U.S.C. 154(b) by 0 days.

(21) Appl. No.: 10/033,490

(22) Filed: Oct. 25, 2001

(65) Prior Publication Data

US 2002/0094626 A1 Jul. 18, 2002

(30) Foreign Application Priority Data

Oct. 25, 2000 (KR) ........................................ 2000-62952

(51) Int. Cl.⁷ ............................................... G11C 7/00
(52) U.S. Cl. .............................. 365/189.11; 365/230.06
(58) Field of Search ........................ 365/189.11, 230.06

(56) References Cited

U.S. PATENT DOCUMENTS 6,344,990 B1 * 2/2002 Matsumiya et al. .......... 365/63

* cited by examiner

*Primary Examiner*—M. Tran
(74) *Attorney, Agent, or Firm*—Marshall, Gerstein & Borun

(57) ABSTRACT

A semiconductor memory device includes a memory cell, a sense amplifying means for driving a bit line during a writing operation in the memory cell and a write driving means for providing data in response to a write command signal. The memory device also includes a power driving means for providing a pull-down voltage and a pull-up voltage to the sense amplifying means in response to a bit line activation signal and a write command signal. The power driving means provides a ground voltage as the pull-down voltage and selectively provides one of a cell power supply voltage and a high voltage as the pull-up voltage.

18 Claims, 5 Drawing Sheets

SEMICONDUCTOR MEMORY DEVICE AND WRITE DRIVING THEREOF

TECHNICAL FIELD

A semiconductor memory device and, more particularly, to a write driving in a semiconductor memory device are disclosed.

DESCRIPTION OF THE RELATED ART

In the case of DRAM, address terminal signals are acknowledged as raw-address signals and input to an internal circuit as soon as raw-address-strobe (/RAS) signals are activated. Certain word lines become enabled by the raw address signals and the bit line pairs of a plurality of memory cells connected to the word lines are amplified by a sense amplifier. Then, when column-address-strobe (/CAS) signals are activated, the address terminal signals are acknowledged as column address signals and input to the internal circuit. After that, a column decoder is enabled and the memory cell of a column is selected from a number of memory cells.

Write-enable (/WE) signals are activated immediately before the column of a certain memory cell is selected to inform the DRAM that the corresponding cycle is a write operation. When a certain column is selected, the write data are loaded on data bus lines by a write driver and the electric potential of the data bus lines is transferred to the bit lines of the selected column.

Meanwhile, to perform the memory access (read/write) operation following the corresponding write operation continuously within a short time, the write path may be precharged by precharging the potential of the data bus line as soon as possible.

The time taken to precharge the databus is commonly referred to as the write recovery time. As the write recovery time increases, the time for a new memory access operation increases, which limits the high-speed operation of the memory device.

In the case that the input data are opposite to the current bus data (i.e., bit line potential) stored in the memory cell in a conventional write driving system, the bit line data are inverted during the enable period of the column selection signals, which are of short pulse, and after the column selection signals are disabled. The bit line sense amplifier drives the potential of the bit line pairs to the cell power supply voltage (Vcc) and the ground voltage (Vss) independently. Thus, the driving power of the sense amplifier affects the write-recovery time.

FIG. 1 is a block diagram showing the write path of a semiconductor memory device in accordance with a conventional method. As shown in FIG. 1, the write path of a conventional semiconductor memory device includes a memory cell 19, a sense amplifier 18 for driving the bit lines of the memory cell 19 to the pull-up and pull-down power, a sense amplifier power driving unit 16 for providing cell power supply voltage (Vcc) as a pull-up power of the sense amplifier 18 and ground voltage (Vss) as its pull-down power, a sense amplifier power driving control unit 14 for generating pull-up and pull-down control signals (Pu, Pd) for controlling the sense amplifier power driving unit 16 in response to the RAS signals, a write control unit 10 for generating write control signals in response to the write command, and a write driving unit 12 for driving the input terminal of the sense amplifier 18 to a level corresponding to the input data in response to the write control signals.

FIG. 2 is a circuit diagram depicting the power driving unit of the sense amplifier of FIG. 1. Referring to FIG. 2, the sense amplifier power driving unit 16 includes a pull-up power driving unit 20 for driving the pull-up power terminal of the sense amplifier 18 to a cell power supply voltage (Vcc) with the control of the pull-up control signal (Pu), and a pull-down power driving unit 24 for driving the pull-down power terminal of the sense amplifier 18 to a ground voltage (Vss) with the control of the pull-down control signal (Pd). The pull-up power driving unit 20 includes an NMOS transistor, of which the gate receives the pull-up control signal (Pu) connected between the cell power supply voltage (Vcc) and the pull-up power terminal of the sense amplifier 18. The pull-down power driving unit 24 consists of an NMOS transistor, pull-down control signals (Pd), connected between the ground voltage (Vss) and the pull-down power terminal of the sense amplifier 18.

As described above, the sense amplifier power driving unit 16 provides the cell power supply voltage (Vcc) as the pull-up power of the sense amplifier 18 and the ground voltage (Vss) as its pull-down power according to the status of RAS signals, regardless of the reception of write commands during the entire period when the RAS signals are activated.

FIG. 3 illustrates waveforms of the write operation of the semiconductor memory device in accordance with a conventional method. Referring to FIG. 3, if RAS signals are synchronized with the rising edge of external clock signals (CLK) and become activated, pull-up control signals (Pu) and pull-down control signals (Pd) are activated. Then, the sense amplifier power driving unit 16 receives the pull-up control signals (Pu) and the pull-down control signals (Pd) and outputs cell power supply voltage (Vcc) and ground voltage (Vss) as pull-up and pull-down power, respectively. Subsequently, the sense amplifier 18 drives bit line pairs (BL or /BL) to the cell power supply voltage (Vcc) and ground voltage (Vss) according to the signals received. Meanwhile, the potential of the bit line pairs (BL or /BL) selected by the write driving unit 12 are inverted when column signals are activated after write commands are input in response to an activation of RAS signals. This is a case where the input data are opposite to the data currently on the corresponding bit lines. The bit line pairs are charged or discharged to cell power supply voltage (Vcc) or ground voltage (Vss) by the operation of the sense amplifier 18. On the other hand, if the precharge signals are received and the RAS signals are inactivated, the pull-up (Pu) and the pull-down (Pd) control signals also become inactive and the sense amplifier stops the operation.

The conventional semiconductor memory device provides cell power supply voltage (Vcc) as the pull-up power (Pu) and the ground voltage (Vss) as the pull-down power (Pd) during the period when RAS signals are activated, regardless of whether the write command is activated or not. This semiconductor memory device, however, does not have any solution for a case when the driving power of the sense amplifier 18 declines as the cell power supply voltage (Vcc) drops. That is, when it goes into the bit line precharge mode after write operation, the bit lines may not be sufficiently activated to reach the cell power supply voltage (Vcc) before beginning the precharge, which slows the recovery time and deteriorates the electrical properties of the semiconductor memory device.

SUMMARY OF THE DISCLOSURE

In accordance with one aspect of the disclosure, a semiconductor memory device includes a memory cell, a sense amplifying means for driving a bit line during a writing operation in a memory cell, a write driving means for providing data in response to a write command signal, a power driving means for providing a pull-down voltage and a pull-up voltage to the sense amplifying means in response to a bit line activation signal and a write command signal. The power driving means may provide a ground voltage as the pull-down voltage, and the power driving means may selectively provide a high voltage as the pull-up voltage. The high voltage may be higher than the cell power supply voltage by a predetermined level.

In accordance with another aspect of the disclosure, a method of driving a bit line pair during a writing operation for semiconductor memory device comprising memory cells and a sense amplifying means may include the steps of driving two lines of the bit line pair to a ground voltage and a cell power supply voltage, respectively, in response to an activation of the bit line activation signal, and driving the bit line pair to a high voltage in response to a write command signal. The high voltage may be higher than the cell power supply voltage by a predetermined level.

DETAILED DESCRIPTION OF THE PRESENTLY PREFERRED EMBODIMENTS

Figure 4:
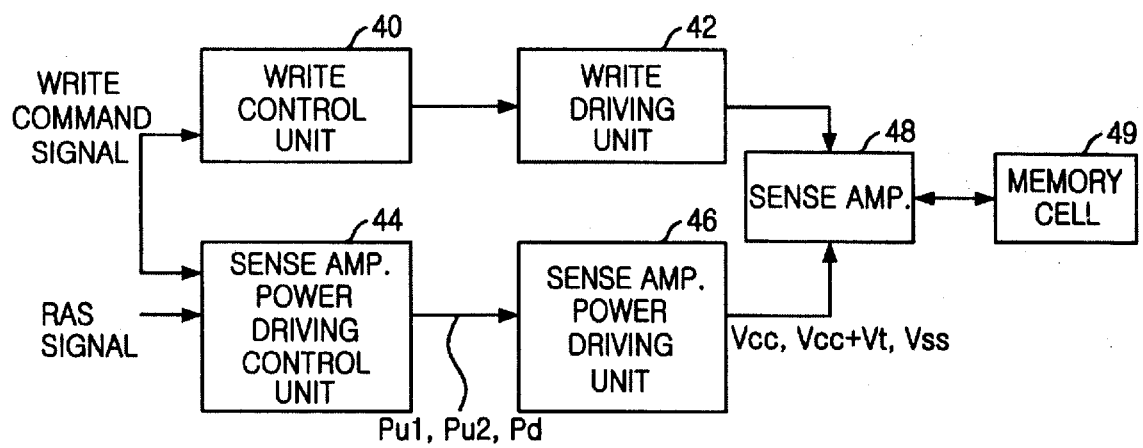
FIG. 4 is an exemplary block diagram showing the write path of a semiconductor memory device in accordance with one aspect of the invention.

FIG. 4 is an exemplary block diagram showing the write path of a semiconductor memory device in accordance with one aspect of the invention. As shown in FIG. 4, the write path of a semiconductor memory device may include a memory cell 49, a sense amplifier 48 for driving the bit lines of the memory cell 49 to the pull-up and pull-down power, a sense amplifier power driving unit 46 for providing the pull-up power (Vcc, Vcc+Vt) and pull-down power (Vss) of the sense amplifier 48, a sense amplifier power driving control unit 44 for generating a first and a second pull-up control signals (Pu1, Pu2) and pull-down control signals (Pd) that control the sense amplifier power driving unit 46 in response to the raw address strobe (RAS) signals and to write command, a write control unit 40 for generating write control signals in response to the write command, and a write driving unit 42 for driving the input terminal of the sense amplifier to a level corresponding to the input data in response to the write control signals.

Figure 1:
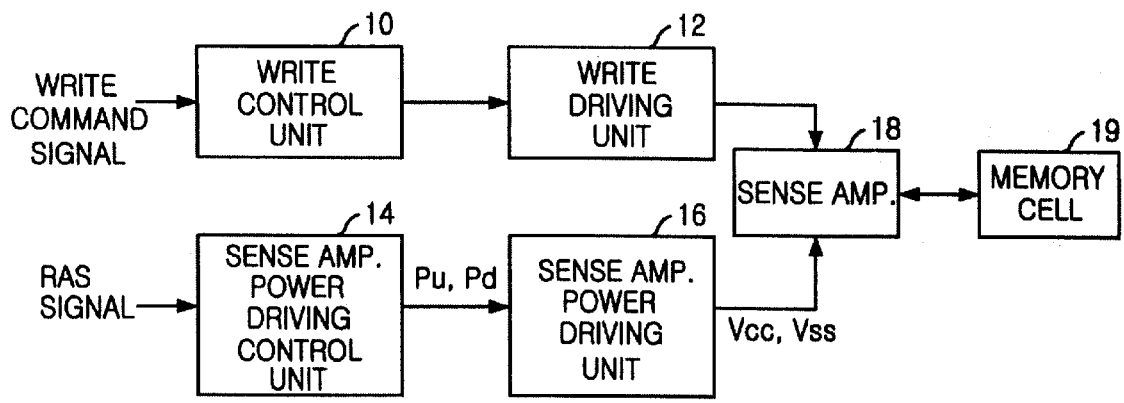
FIG. 1 is an exemplary block diagram showing the write path of a semiconductor memory device in accordance with a conventional device.
Figure 2:
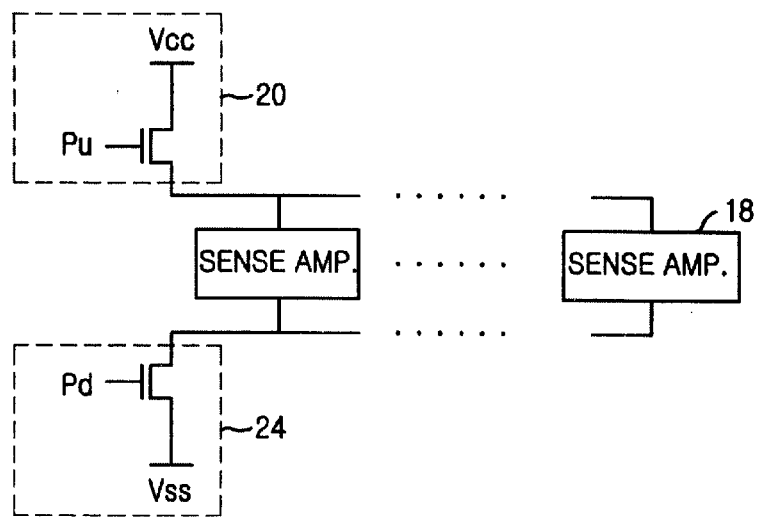
FIG. 2 is an exemplary circuit diagram depicting the power driving unit of the sense amplifier of FIG. 1.
Figure 3:
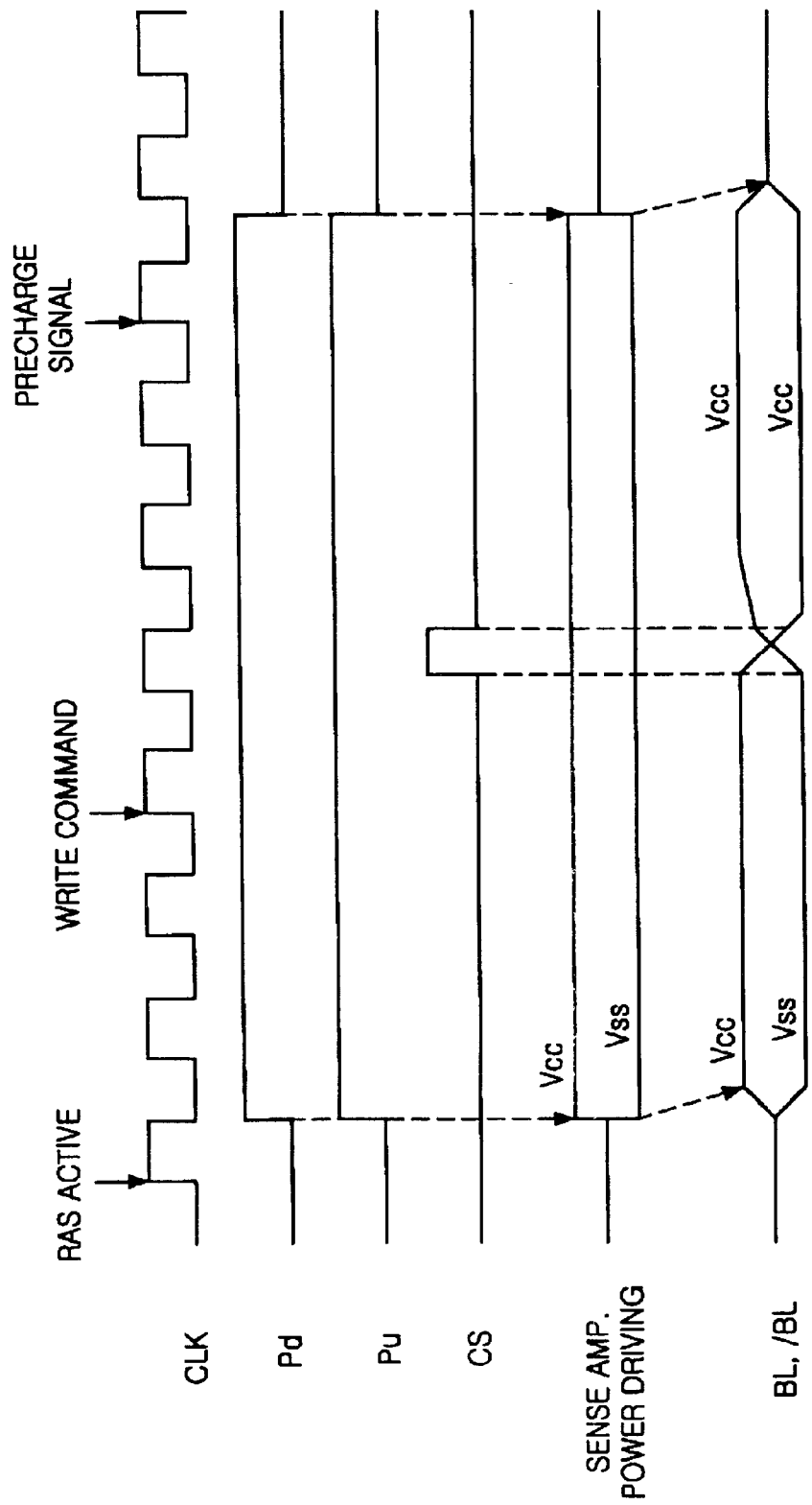
FIG. 3 illustrates waveforms of the write operation of a conventional semiconductor memory device.

Generally, the structure of the write path of the semiconductor memory device shown in FIG. 4 is similar to that of a conventional device, such as that depicted in FIG. 1. However, the sense amplifier power driving control unit 44 of the device shown in FIG. 4 is controlled by not only RAS signals but also the write command as well. Additionally, the device shown in FIG. 4 generates pull-up control signals (Pu1, Pu2) selectively according to the receipt of write commands. In response to the pull-up control signal (Pu1, Pu2) from the sense amplifier power driving control unit 44, the sense amplifier power driving unit 46 provides cell power supply voltage (Vcc) or high voltage (Vcc+Vt), which is greater than the power supply voltage by a predetermined potential, as the pull-up power of the sense amplifier 48.

Figure 5:
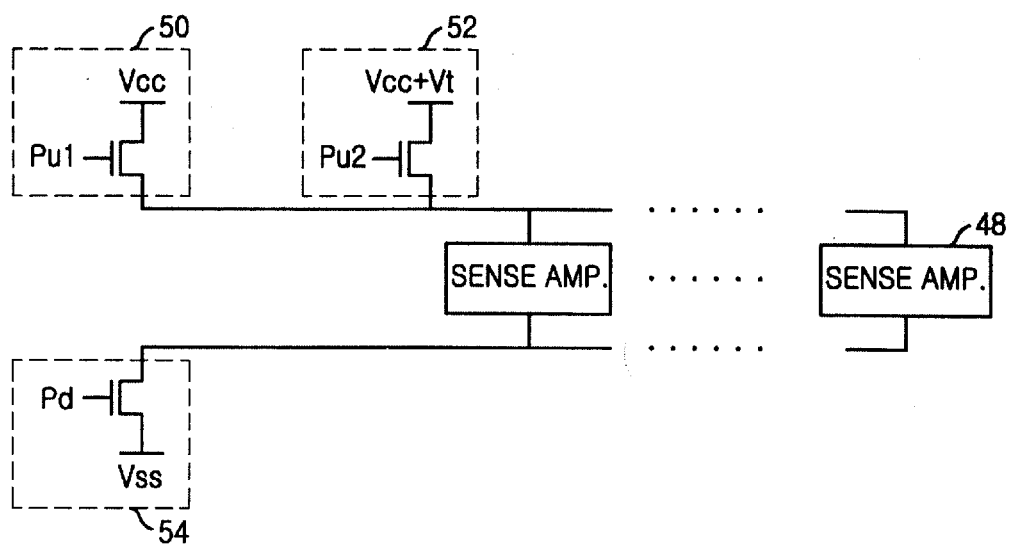
FIG. 5 is an exemplary circuit diagram of the power driving unit of the sense amplifier depicted in FIG. 4.

FIG. 5 illustrates a circuit of the power driving unit 46 of the sense amplifier 48 depicted in FIG. 4. As shown in FIG. 5, the sense amplifier power driving unit 46 includes a first pull-up power driving unit 50 for driving the pull-up power terminal of the sense amplifier 48 to the cell power supply voltage (Vcc) with the control of the first pull-up control signal (Pu1), a second pull-up power driving unit 52 for driving the pull-up power terminal of the sense amplifier 48 to the high voltage (Vcc+Vt) with the control of the second pull-up control signal (Pu2), and a pull-down power driving unit 54 for driving the pull-down power terminal of the sense amplifier 48 to the ground voltage (Vss) with the control of the pull-down control signals (Pd). The first pull-up power driving unit 50 may include an NMOS transistor, of which the gate receives the first pull-up control signals (Pu1), connected between the cell power supply voltage (Vcc) and the pull-up power terminal of the sense amplifier 48. The second pull-up power driving unit 52 may include an NMOS transistor, of which the gate receives the second pull-up control signal (Pu2), connected between the high voltage (Vcc+Vt) and the pull-up power terminal of the sense amplifier 48. The pull-down power driving unit 54 may include an NMOS transistor, of which the gate receives pull-down control signals (Pd), connected between the ground voltage (Vss) and the pull-down power terminal of the sense amplifier 48. The high voltage (Vcc+Vt) is greater than the cell power supplying voltage (Vcc) by as much as the threshold voltage (Vt) of the NMOS transistor. Of course, the NMOS transistor may be replaced with a PMOS transistor if desired.

Meanwhile, the sense amplifier power driving control unit 44 is formed with a conventional signal generator that generates control signals by logically combining the RAS signals and the write command and inverting the two pull-up control signals (Pu1 and Pu2). For example, when the RAS signals are activated but the write commands are not yet activated, the power driving control unit 44 generates Pu1= logic high and Pu2=logic low. When the write commands are input, the power driving control unit 44 generates Pu1=logic low and Pu2=logic high. The description of the structure and operation of a signal generator will be omitted as they are widely known.

Figure 6:
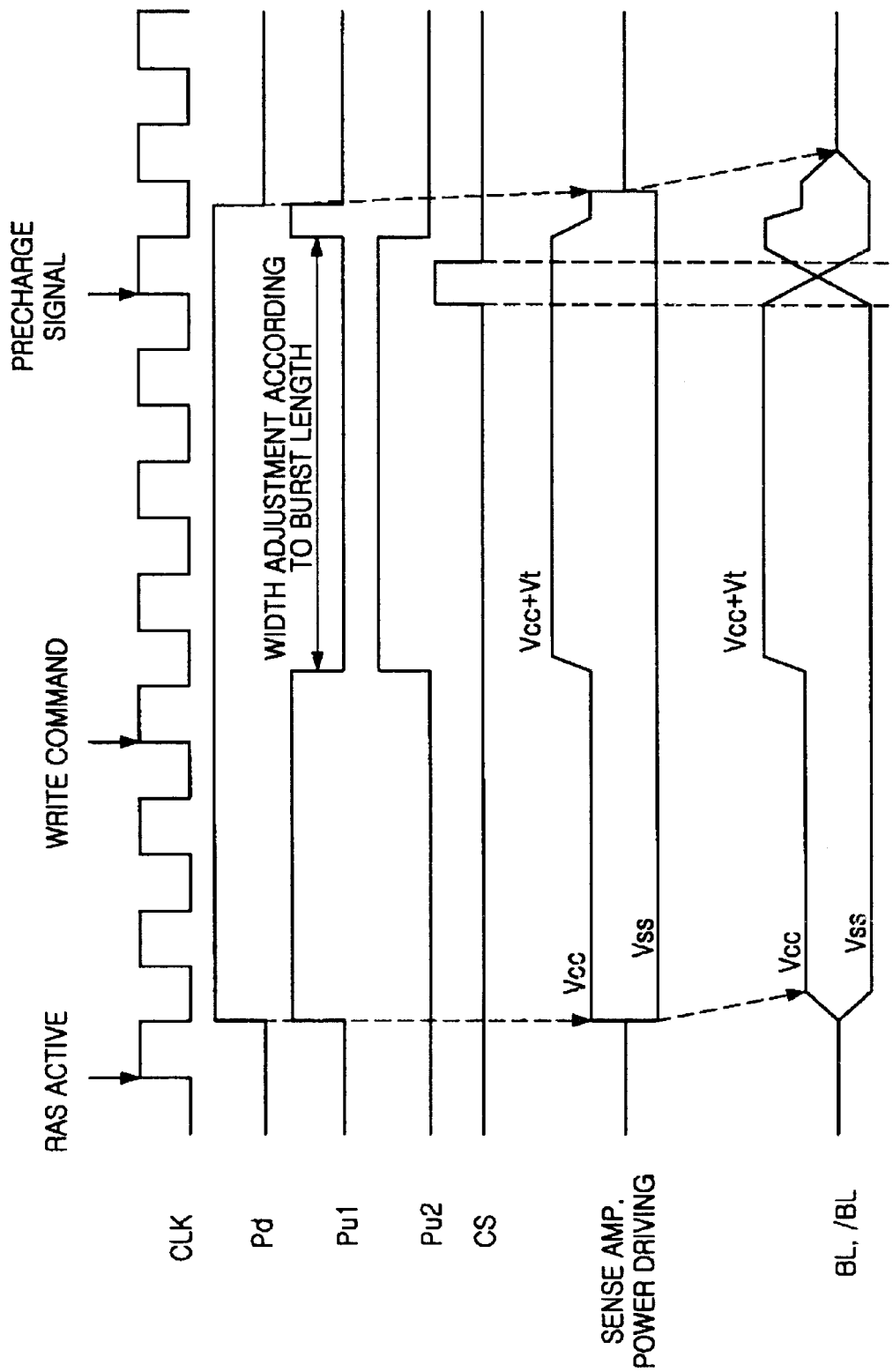
FIG. 6 illustrates waveforms of the write operation of the semiconductor memory device shown in FIG. 5.

FIG. 6 illustrates waveforms of the operation of the semiconductor memory device shown in FIG. 5. Referring to the drawings, the operation of the circuit illustrated in FIGS. 4 and 5 will be described hereinafter.

When RAS signals are activated in synchronization with the rising edge of an external clock signal (CLK), the first pull-up signal (Pu1) and the pull-down signal (Pd) are enabled and the first pull-up power driving unit 50 of the sense amplifier power driving unit 46 and the NMOS transistor of the pull-down power driving unit 54 are turned on by the first pull-up signal (Pu1) and the pull-down signal (Pd). Thus, the same amplifier power driving unit provides the cell power supply voltage (Vcc) as a pull-up power of the sense amplifier 48 and the ground voltage (Vss) as its pull-down power. Accordingly, the sense amplifier 48 drives bit line pairs (BL, /BL) to the cell power supply voltage (Vcc) and the ground voltage (Vss).

Meanwhile, if the write commands are input when RAS signals are activated, the first pull-up control signal (Pu1) is disabled and the second pull-up control signal (Pu2) is enabled. Additionally, the NMOS transistor of the second pull-up power driving unit 52 of the sense amplifier power driving unit 46 is turned on, thereby providing high voltage (Vcc+Vt) as a pull-up power of the sense amplifier 48 and ground voltage (Vss) as its pull-down power. Accordingly, the sense amplifier 48 drives bit line pairs (BL, /BL) to the high voltage (Vcc+Vt) and the ground voltage (Vss).

After the write commands have been input, the voltage of the bit line pair (BL, /BL) selected by the write driving unit 12 is inverted while the column selection signals (CS) are activated. This is a case where the input data are opposite to the data of corresponding bit lines.

The bit line pairs are charged or discharged to high voltage (Vcc+Vt) or ground voltage (Vss) by the operation of the sense amplifier 48.

The enable period of the second pull-up control signal (Pu2) is determined according to the burst length of a corresponding memory device. When the final data to the burst length is recorded in the selected memory cell, the sense amplifier power driving unit 46 stops the operation of supplying the high voltage (Vcc+Vt) and begins to provide the cell power supply voltage (Vcc) again.

In the mean time, if bit line precharge signals are received and the RAS signals are inactivated, the sense amplifier power driving unit 46 stops the operation of supplying the pull-up and pull-down power completely and performs bit line precharge operation.

As described above, the sense amplifier is pull-up driven to the high voltage (Vcc+Vt), which is higher than the cell power supply voltage (Vcc). As a result, the driving power is improved while the sense amplifier drives bit lines after the activation period of the column selection signal (CS), which makes it possible to charge or discharge bit lines faster. On the other hand, the bit lines are pull-up-driven to the cell power supply voltage (Vcc) after the final data according to the burst length are written in the selected memory cell but the precharge signals are not yet input. Therefore, the time taken for being converted into the subsequent precharge mode does not increase.

Figure 7:
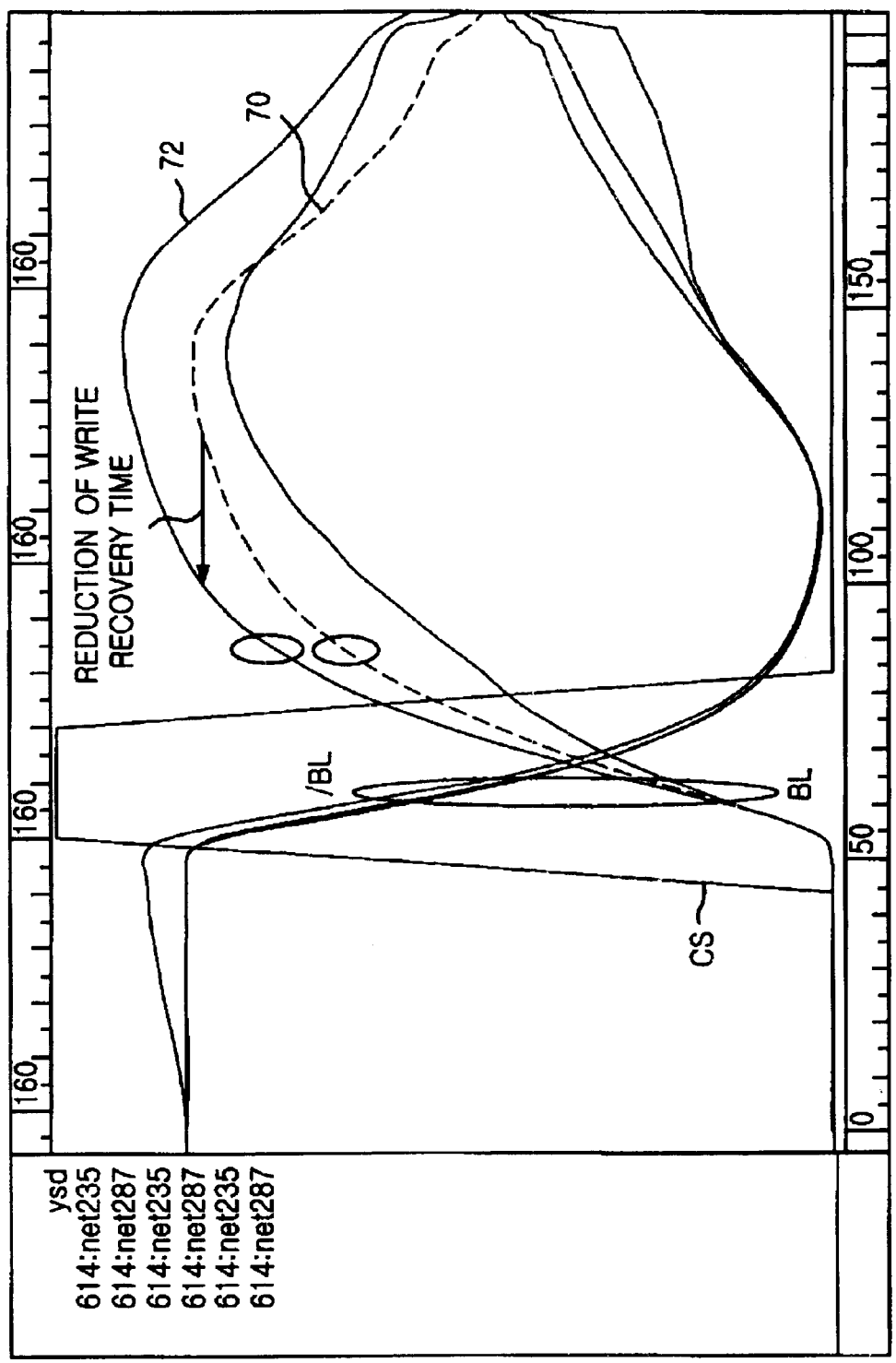
FIG. 7 depicts simulatedwave forms of the write operations of a conventional semiconductor memory device and a semiconductor device in accordance with one aspect of the invention.

FIG. 7 depicts simulated waveforms of the write operations of a conventional semiconductor memory device and a device in accordance with one aspect of the invention. FIG. 7 shows that the potential gap between the bit line pairs (BL, /BL) inverted by a write driver is being recovered during the activation period of the column selection signals (CS) in this invention (a) faster than in a conventional technique (b), thereby shortening the write recovery time and securing the timing margin during write operation by improving the driving power of the sense amplifier.

While the disclosed devices and methods have been described with respect to certain preferred embodiments, it will be apparent to those skilled in the art that various changes and modifications may be made without departing from the spirit and the scope of the disclosed devices and methods as defined in the following claims.

What is claimed is:

1. A semiconductor memory device comprising:
a memory cell;
a sense amplifying means for driving a bit line during a writing operation in the memory cell;
a write driving means for providing data in response to a write command signal; and
a power driving means for providing a pull-down voltage and a pull-up voltage to the sense amplifying means in response to a bit line activation signal and a write command signal, wherein the power driving means provides a ground voltage as the pull-down voltage, wherein the power driving means selectively provides one of a cell power supply voltage and a high voltage as the pull-up voltage, and wherein the high voltage is greater than the cell power supply voltage by a predetermined amount.

2. The semiconductor memory device as recited in claim 1, wherein the write driving means includes a write control unit adapted to output a write control signal in response to the write command signal and a write driving unit for driving an input terminal of the sense amplifying means in response to the write command signal.

3. The semiconductor memory device as recited in claim 2, wherein the power driving means includes:
a control signal generating unit for generating a pull-down control signal, a first pull-up control signal and a second pull-up control signal, by combining the bit line activation signal and the write command signal; and
a power driving unit for generating the pull-down voltage and the pull-up voltage in response to the pull-down control signal, the first pull-up control signal and the second pull-up control signal.

4. The semiconductor memory device as recited in claim 3, wherein the power driving unit includes:
a pull-down voltage driver for generating the ground voltage as the pull-down voltage in response to the pull-down control signal;
a first pull-up voltage driver for generating the cell power supply voltage as the pull-up voltage in response to the first pull-up control signal; and
a second pull-up voltage driver for generating the high voltage as the pull-up voltage in response to the second pull-up control signal.

5. The semiconductor memory device as recited in claim 4, wherein the pull-down voltage driver includes a first MOS transistor for receiving the pull-down control signal and transmitting the ground voltage to a pull-down voltage input terminal of the sense amplifying means, wherein the pull-down control signal is input to a gate of the first MOS transistor.

6. The semiconductor memory device as recited in claim 5, wherein the first pull-up voltage driver includes a second MOS transistor for receiving the first pull-up control signal and transmitting the cell power supply voltage to a pull-up voltage input terminal of the sense amplifying means, wherein the first pull-up control signal is input to a gate of the second MOS transistor.

7. The semiconductor memory device as recited in claim 6, wherein the second pull-up voltage driver includes a third MOS transistor for receiving the second pull-up control signal and transmitting the high voltage to the pull-up voltage input terminal of the sense amplifying means, wherein the second pull-up control signal is input to the gate of the second MOS transistor.

8. The semiconductor memory device as recited in claim 4, wherein the first pull-up control signal and the pull-down control signal are enabled when the first pull-up control signal and the pull-down control signal are synchronized with activation of the bit line activation signal.

9. The semiconductor memory device as recited in claim 8, wherein the second pull-up control signal is enabled when the second pull-up control signal is synchronized with the write command signal.

10. The semiconductor memory device as recited in claim 8, wherein the pull-down control signal is enabled when the pull-down control signal is synchronized with inactivation of the bit line activation signal.

11. The semiconductor memory device as recited in claim 8, wherein the first pull-up control signal is disabled when the first pull-up control signal is synchronized with inactivation of one of the write command signal and the bit line activation signal.

12. The semiconductor memory device as recited in claim 9, wherein the second pull-up control signal is produced in response to a burst length.

13. The semiconductor memory device as recited in claim 7, wherein the high voltage is higher than the cell power supply voltage by a threshold voltage of the third MOS transistor.

14. The semiconductor memory device as recited in claim 11, wherein the bit line activation signal is a row address strobe signal.

15. The semiconductor memory device as recited in claim 11, wherein the bit line activation signal is inactivated by a precharge signal.

16. A method of driving a bit line pair during a writing operation for semiconductor memory device having memory cells and a sense amplifying means, the method comprising the steps of:

driving two lines of the bit line pair to a ground voltage and a cell power supply voltage, respectively, in response to an activation of a bit line activation signal; and driving the bit line pair to a high voltage and the ground voltage in response to a write command signal, wherein the high voltage is greater than the cell power supply voltage by a predetermined amount.

17. The method as recited in claim 16, wherein the method further comprises the step of inverting a potential of the bit line pair during the enable period of a column selection signal.

18. The method as recited in claim 16, wherein the high voltage is greater than the cell power supply voltage by a threshold voltage of a MOS transistor.

* * * * *